US011871532B2

(12) United States Patent
Mayer et al.

(10) Patent No.: US 11,871,532 B2
(45) Date of Patent: Jan. 9, 2024

(54) HOUSING FOR RAILROAD SWITCH

(71) Applicants: Sebastian Mayer, Riederich (DE); Andreas Stiegler, Kirchentellinsfurt (DE)

(72) Inventors: Sebastian Mayer, Riederich (DE); Andreas Stiegler, Kirchentellinsfurt (DE)

(73) Assignee: HIRSCHMANN AUTOMATION AND CONTROL GMBH, Neckartenzlingen (DE)

( * ) Notice: Subject to any disclaimer, the term of this patent is extended or adjusted under 35 U.S.C. 154(b) by 343 days.

(21) Appl. No.: 17/284,690

(22) PCT Filed: Oct. 31, 2019

(86) PCT No.: PCT/EP2019/079866
§ 371 (c)(1),
(2) Date: Apr. 12, 2021

(87) PCT Pub. No.: WO2020/089412
PCT Pub. Date: May 7, 2020

(65) Prior Publication Data
US 2022/0418136 A1 Dec. 29, 2022

(30) Foreign Application Priority Data
Oct. 31, 2018 (DE) .......................... 102018127249.9

(51) Int. Cl.
*B61L 15/00* (2006.01)
*H05K 5/06* (2006.01)
*H05K 5/02* (2006.01)
*H05K 5/03* (2006.01)

(52) U.S. Cl.
CPC .......... *H05K 5/069* (2013.01); *B61L 15/0036* (2013.01); *H05K 5/0247* (2013.01); *H05K 5/03* (2013.01)

(58) Field of Classification Search
None
See application file for complete search history.

(56) References Cited

U.S. PATENT DOCUMENTS

| 6,081,048 A * | 6/2000 | Bergmann | H05K 7/1472 307/147 |
| 6,166,909 A | 12/2000 | Sumida | |
| 6,802,737 B2 * | 10/2004 | Bergner | H05K 7/1465 439/716 |
| 2002/0004343 A1 * | 1/2002 | Morikawa | H05K 7/1468 439/716 |
| 2002/0182942 A1 * | 12/2002 | Lieb | H05K 7/1465 439/717 |
| 2003/0048611 A1 * | 3/2003 | Skofljanec | H05K 7/20854 361/719 |
| 2004/0171311 A1 * | 9/2004 | Sichner | H05K 5/069 439/701 |

(Continued)

*Primary Examiner* — Xanthia C Relford
(74) *Attorney, Agent, or Firm* — Andrew Wilford

(57) ABSTRACT

The invention relates to a housing (2) of a switch (1) for railroad applications, which housing has, in a sectional view or when viewed from the side, approximately an L-shaped cross-section, wherein the inputs (6) and outputs (7) project upward approximately vertically on the one leg (4) and the inputs (8) and outputs (9) extend approximately at a right angle thereto from the other leg (5).

3 Claims, 6 Drawing Sheets

(56) References Cited

U.S. PATENT DOCUMENTS

| | | | |
|---|---|---|---|
| 2012/0149247 A1* | 6/2012 | Halim | H01R 9/2458 439/660 |
| 2014/0240946 A1 | 8/2014 | Fukumasu | |

* cited by examiner

HOUSING FOR RAILROAD SWITCH

CROSS REFERENCE TO RELATED APPLICATIONS

This application is the US-national stage of PCT application PCT/EP2019/079866 filed 31 Oct. 2019 and claiming the priority of German patent application 102018127249.9 itself filed 31 Oct. 2018.

FIELD OF THE INVENTION

The invention relates to a housing for a switch for railway applications.

BACKGROUND OF THE INVENTION

Switches that have a housing and that are in particular in railway passenger cars are known. These are used for data transfer and, if necessary, also for energy transmission.

Housings for such switches are known in which the input ports and output ports (such as connections for supply, management and data transmission for the cables with which the data transfer takes place) are in only one single level so that the connectors at the end of the cables are all in plugged into these input ports and output ports on a single level. This leads to a very large, that is to say additional enlargement of the required installation space and thus to a tall construction of the overall system switch, so that the installation space available for this, for example in the passenger cars or floors and ceilings thereof, is generally not sufficient.

SUMMARY OF THE INVENTION

The object of the invention is therefore to provide a switch that improves railway applications compared to known switches, especially with regard to a compact design and a improved regular operation.

According to the invention the housing of the switch has a flat part and a higher part projecting beyond this flat part, input ports on the flat part and output ports are the upper side of this part and the cables with their connectors plugged approximately vertically into them input ports and output ports.

The other input ports and output ports in the taller part extend approximately at right angles to do so. In this way, the housing of the new switches in section or viewed from the side are in approximately an L-shaped cross-section, the input ports and output ports standing on one leg approximately vertically upward and the input ports and output ports extending roughly at right angles thereto from the other leg.

It is thereby achieved that all cable ducts within the maximum height specified by the housing in which preferred direction can take place.

Another benefit of this connector arrangement is that all connections are in only one sub-area, but these are still are quite accessible. This is the remaining area free of lines and cooling fins can be more effective work because the natural convection is less obstructed becomes. In this area, components can then be increased power dissipation can be placed.

Further refinements of the housing according to the invention (or a switch with such a housing that is constructed and suitable for use in railway technology) are described in the subclaims that result in corresponding advantages. These are also described with reference to the following description of the figures without limitation to the shown and described embodiment.

BRIEF DESCRIPTION OF THE DRAWING

An embodiment of a housing of a switch as well as detailed configurations are shown in the drawing in several views. Therein.

SPECIFIC DESCRIPTION OF THE INVENTION

Figure 1A:
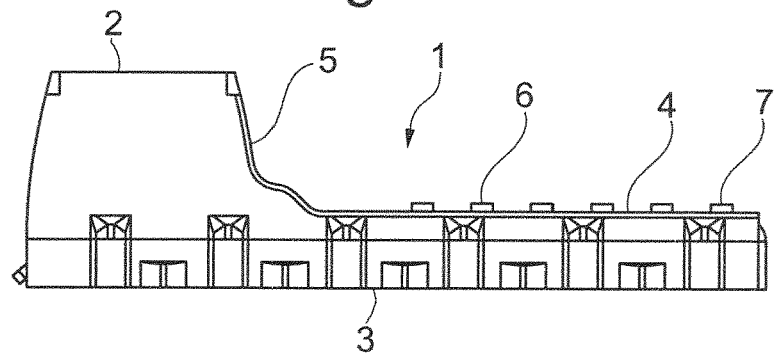
FIGS. 1A, 1B, and 1C show different views of the switch.
Figure 1B:
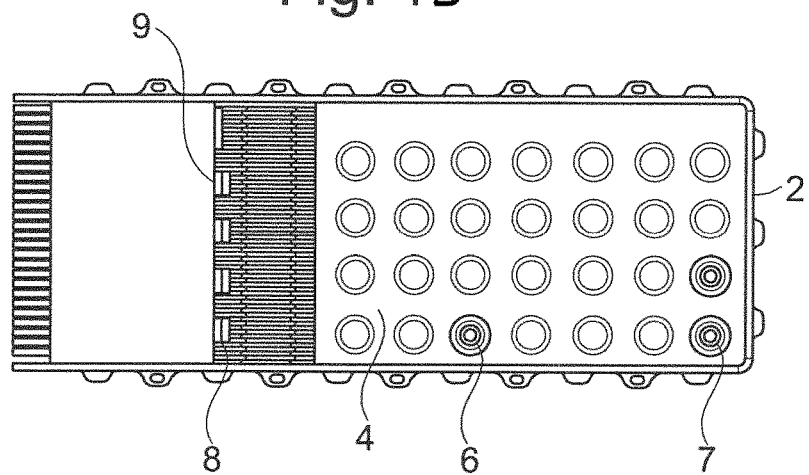
Figure 1C:
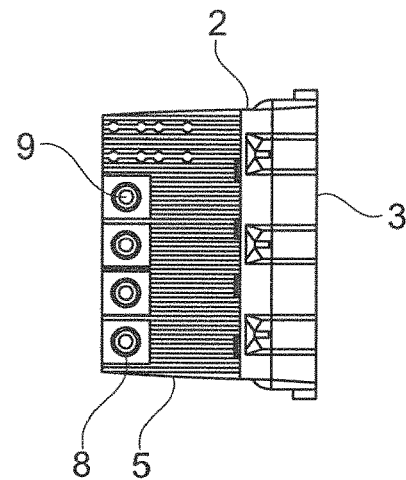

FIG. 1 shows, in detail, various views of a switch 1 for railway applications. This switch 1 has a housing 2 having a lower face 3 that supports and if necessary fixes the housing 2, for example, on a surface of an installation location of the switch 1. A first (substantially flat) leg 4 is approximately parallel to the lower face 3 of the housing 2, and another (also substantially flat) leg 5 is approximately perpendicular to this first leg 4. The corner area between the two legs 4, 5 can be sharp, for example at an angle of 90°. In the illustrated embodiment, the transition area is rounded. On the upper region of the leg 4 there is at least one connection, but preferably several connections for connectors or the like. These connections are at least one or more input ports 6, preferably several input ports, and/or at least one output port 7, preferably several output ports 7. Analogously, the face of the leg 5 has at least one output port and/or one input port available. With this embodiment there are two input ports 8 and two output ports 9. The number of input ports 6, 8 or output ports 7, 9 is shown by way of example and can be more or fewer. Thus, the FIG. 1 switch 1 has a housing suitable for railway applications and is formed and of L-shape as seen from the side, with the input ports 6 and output ports 7 on the one leg 4 projecting approximately vertically upward and the input ports 8 and output ports 9 projecting perpendicular thereto from the other leg 5.

Figure 2:
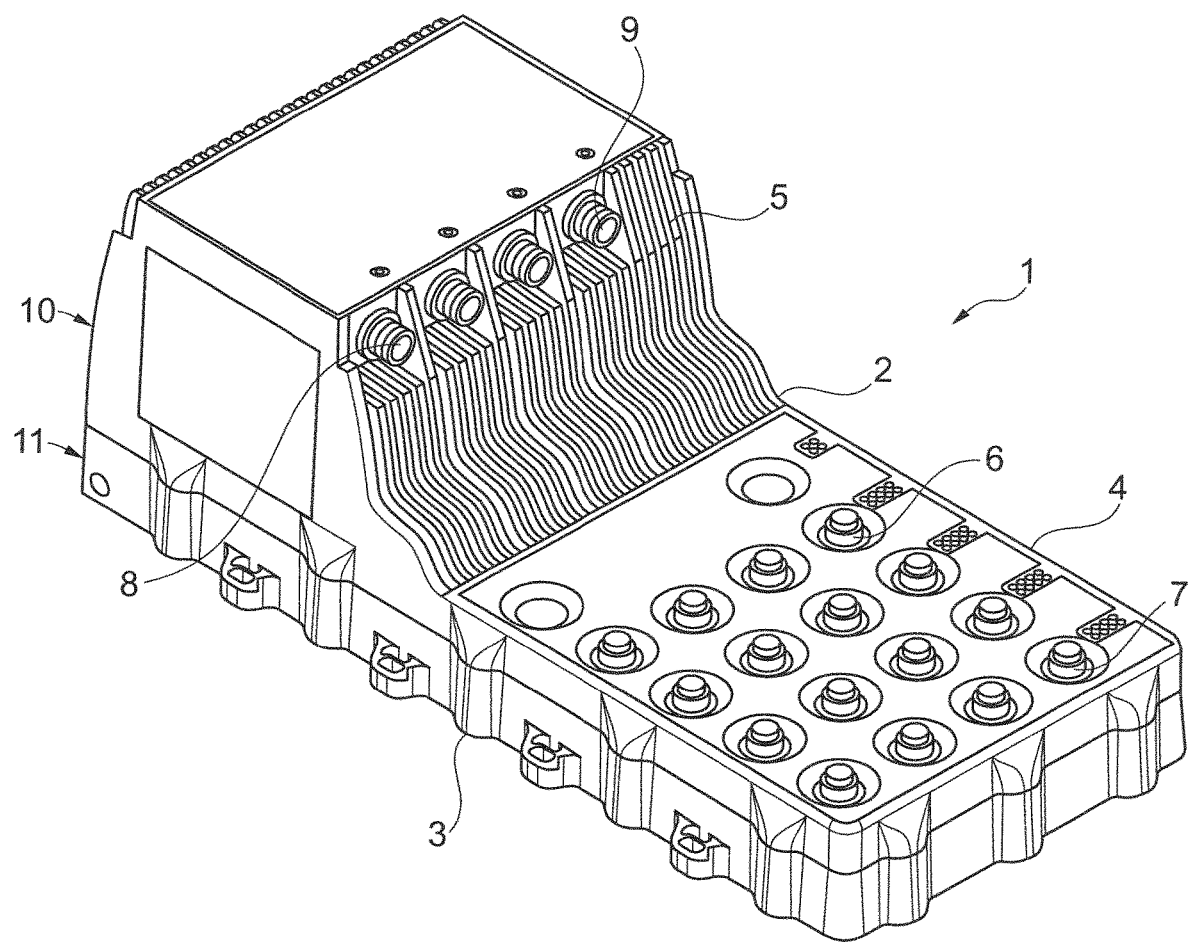
FIG. 2 is a top view of the switch from obliquely above.

FIG. 2 shows a top view of the switch 1 at an angle from above. This view shows that the housing 2 is formed by at least two parts. Such two-part construction of the housing 2 is formed by an upper part 10 and a lower part 11. The lower part 11 is flat, and the upper part 10 having two flat areas that form the legs 4 and 5. In addition, the upper part 10 projects roof-like upward to form the leg 5.

FIGS. 3 to 7 are three-dimensional exploded views of the switch 1. In addition the elements of the switch 1 that are already described with reference to FIGS. 1 and 2 have the same reference numbers and will be referred to further below in detail.

It is first shown that the upper part 10 is secured by screws 12 to the lower part 11 to close the housing 2.

The upper part 10 and/or the lower part 11 have cooling ribs 13 at the end, especially at the roof-shaped region of the upper part 10. Such cooling ribs can also be in the corner transition area, in particular the arcuate transition area, between the leg 4 and the leg 5.

At least one circuit board is held inside the housing 2 with electrical, electromechanical and electronic components for implementation the function of the switch 1. At least one circuit board serves the input and output ports so that signals from outside are fed to the input ports components, processed and fed to the output ports.

In this embodiment, the leg 4, more precisely below the surface of this leg 4, holds for example two circuit boards 14, 15 arranged separately from one another. The two circuit boards 14, 15 are approximately parallel to the lower face 3 of the housing 2. The same goes for one further circuit board 16 that is mounted parallel to and below the two circuit boards 14, 15. Roughly perpendicular, is preferably exactly perpendicular to the circuit boards 14, 15, 16 there is a printed circuit board 17 in the leg 5. Here too, there can be more than one printed circuit board 17.

In order to separate the two circuit boards 14, 15 both electrically (high-frequency technology), mechanically as well as possibly thermally from the circuit board 17, the housing 2 is provided with a partition 18. Alternatively is also possible to thermally couple the circuit boards to increase heat distribution or heat dissipation of the electronic components. In this case the separator has no thermal insulating, but a thermally conducting (transmitting) function. Here thus generally or also in context with the description of the embodiment, the term "partition" serves for the separating or thermally coupling property.

Figure 3:
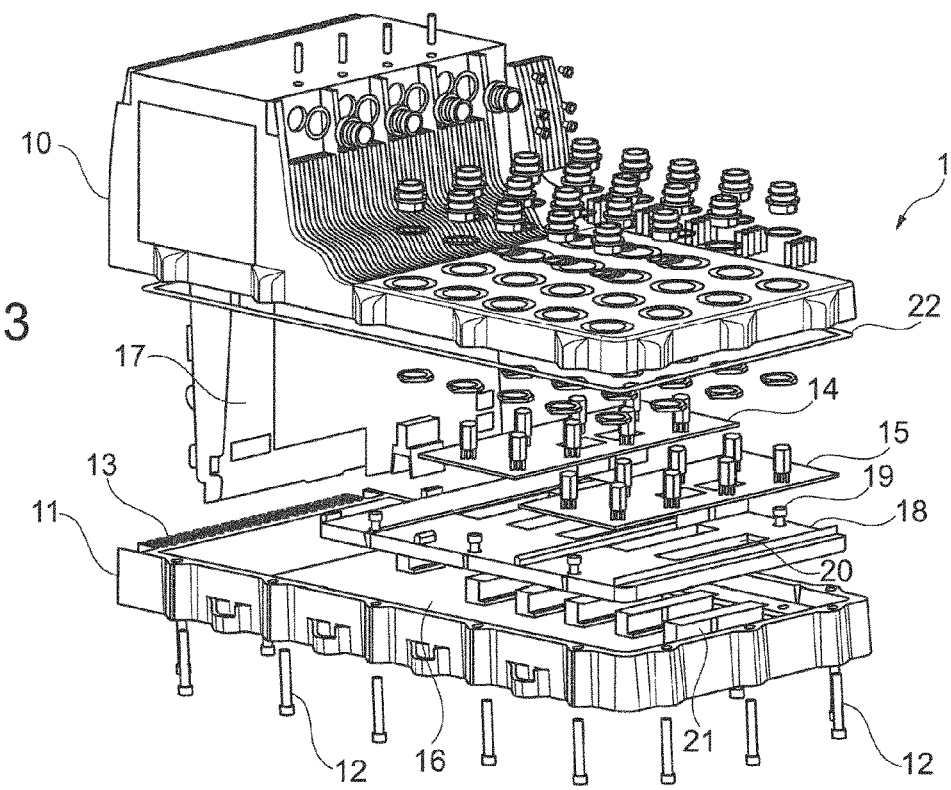
FIGS. 3 to 7 are three-dimensional views of the switch in various exploded views.
Figure 4:
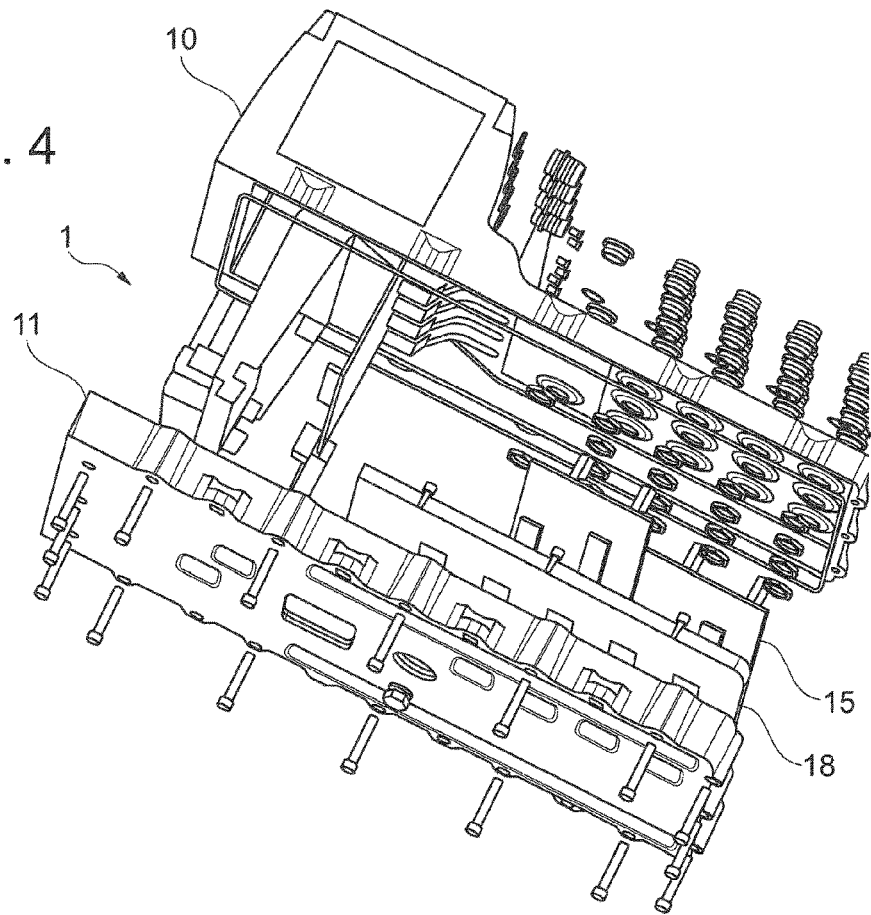
Figure 5:
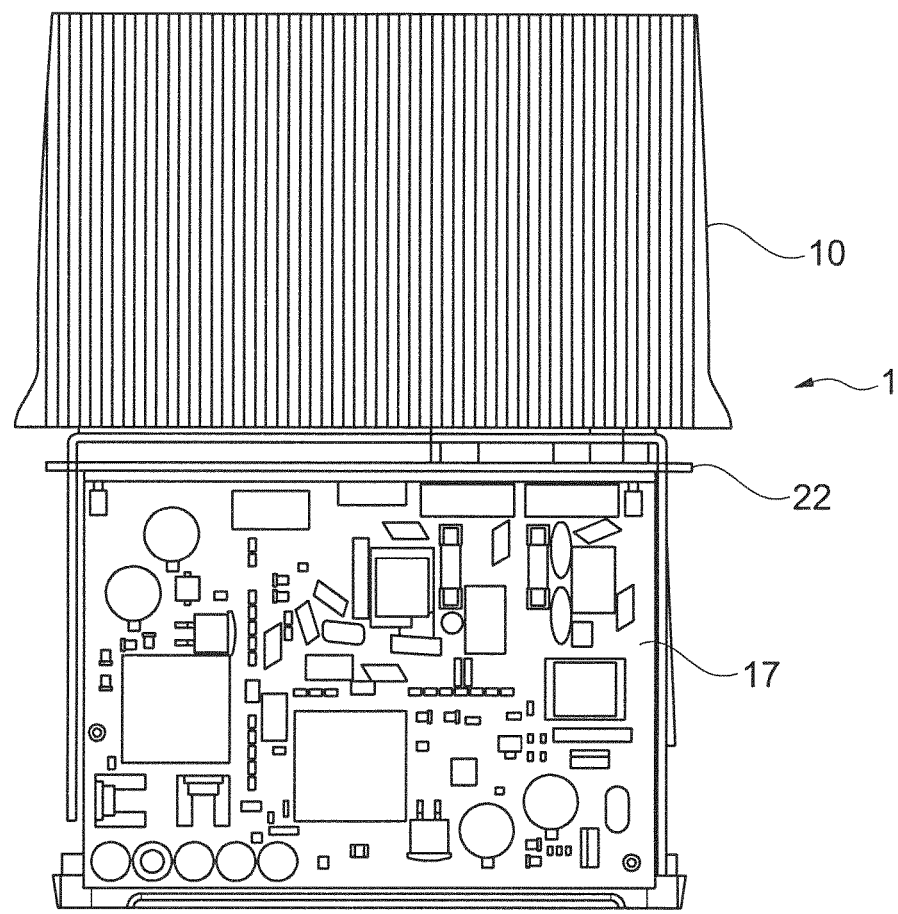
Figure 5:
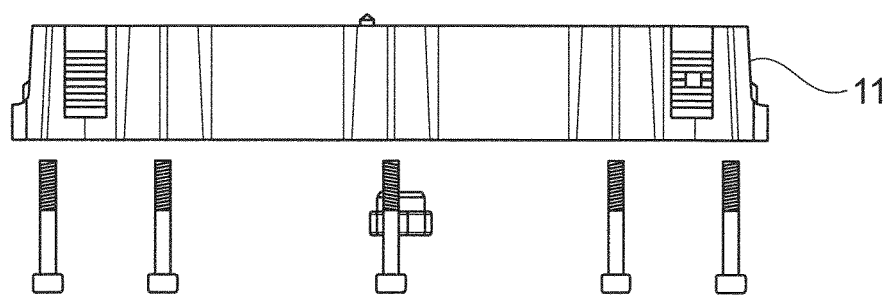
Figure 6:
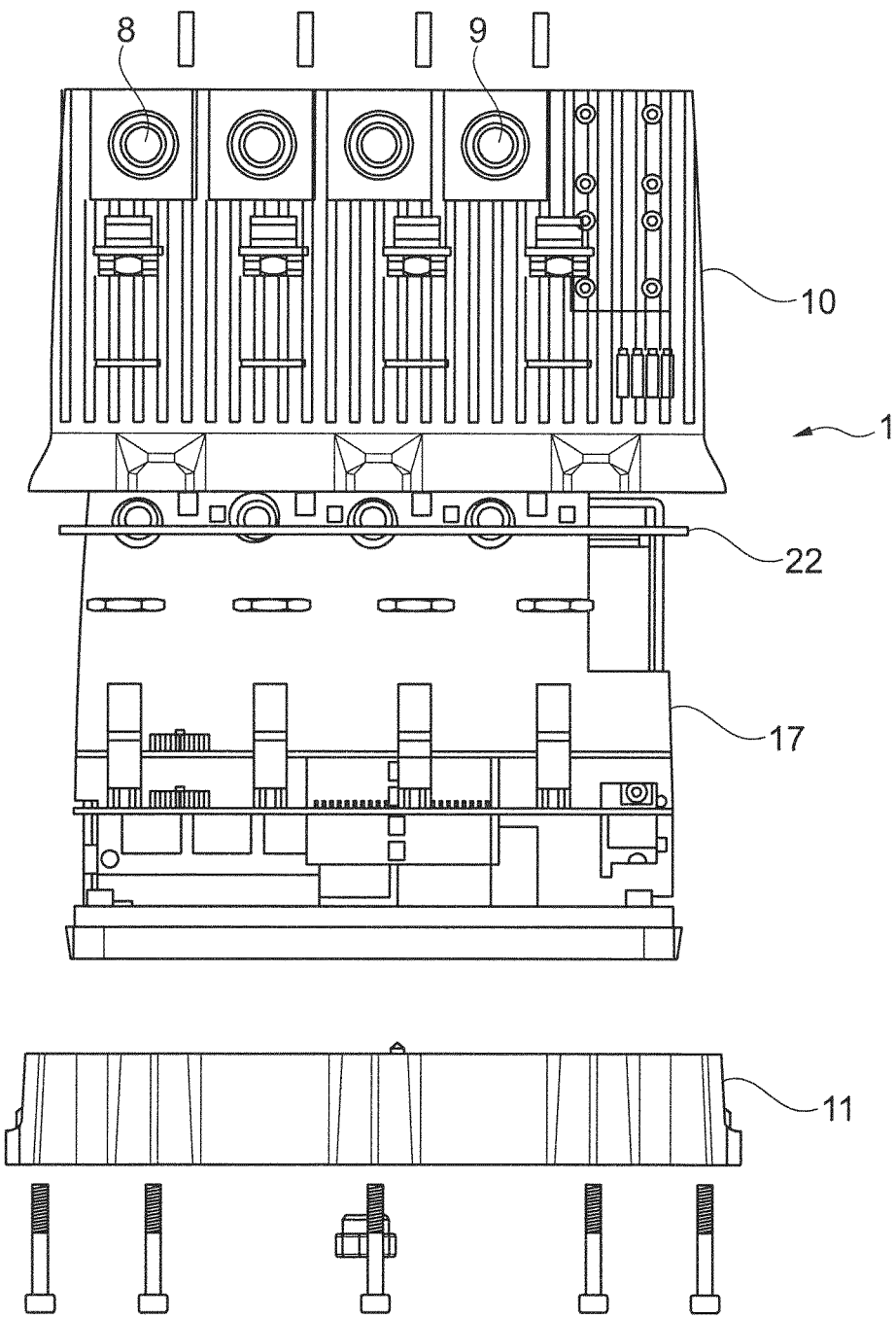
Figure 7:
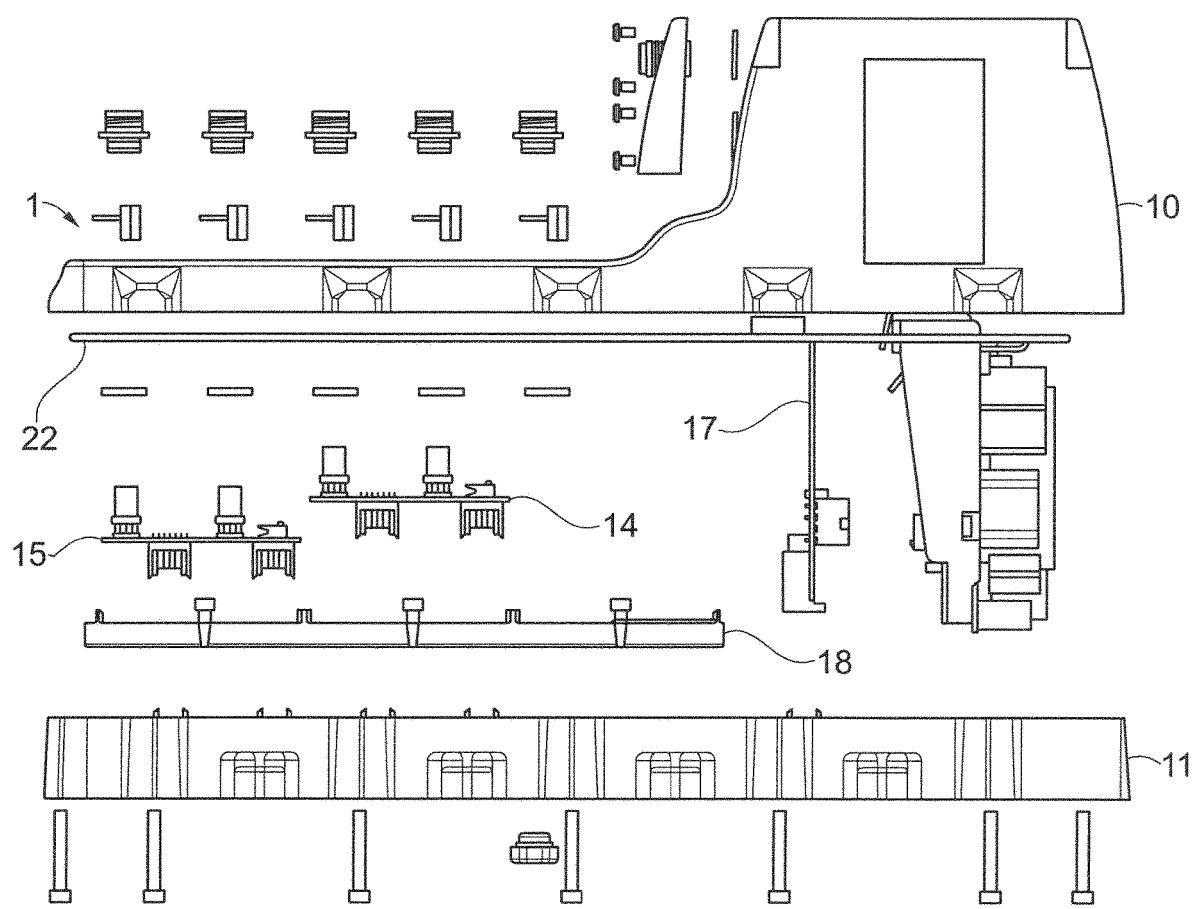

The partition 18 is designed to be flat. It can be made of electrically conductive material, such as sheet steel, however also made of non-electrically conductive material, such as plastic. For the thermal separation of the two circuit boards 14, 15 from the circuit board 16, the partition 18 is made of an insulating material, for example a plastic, and extends over the entire surface of the lower face 3 of the housing 2. If an electrical and/or mechanical separation of the two circuit boards 14, 15 (or just one PCB or more than 2 PCBs) from the circuit board 17 is wanted, the separator 18 consists of an electrically conductive material. As a result, in particular the components on the circuit boards 14, 15 are shielded from interference radiation from the components on the circuit board 16 (or the other way around). The partition 18 is attached by at least one screw 19, preferably several screws, to the housing 2, for example as shown in FIG. 3 on the lower part 11 of the housing 2. For the purpose of implementation, the partition 18 at least one recess 20, preferably several recesses 20, on. Via this at least one recess 20 can for example be a connector 21, which is on the circuit board 16 is arranged through the partition 18 carried out and with a corresponding mating connector the circuit board 14 and 15 are connected. To the inside of the housing 2 must be protected from external influences between the circumferential free edges of the upper part 10 and the lower part 11 a seal 22 can be inserted.

The above remarks with regard to the printed circuit boards and optionally of the partition, which is at?? the leg 4 are arranged, apply analogously to the at least a printed circuit board and possibly a further partition in the leg area 5.

The exploded view in FIG. 3, as well as others representations of FIGS. 4 to 7 can easily be further details of the switch 1 according to the invention can be found, in particular the design of the input ports (plug connectors) and output ports (connectors) concerns.

The assembly process can also be seen. Regarding FIG. 3, for example, the lower part 11 is provided, the printed circuit board 16 is inserted there and then the partition 18 assembled. Thereafter, the at least one circuit board 14, such as shown the two circuit boards 14.1 5, on the separator 18 arranged and secured in a suitable manner. same for the circuit board 17 and optionally there as well provided partition. Then the upper part 10 of the housing 2 on the lower part 11, with the intermediate assignment of the seal 22, placed, the on the circuit boards 14, 15 arranged connector through corresponding recesses in the leg 4 can be carried out. Then the then projecting plug connector screw connections attached, as is the case for the elements and their assembly at the leg 5 applies. Then the upper part 10 and the lower part 11 by means of the screws 12 finally with each other connected so that switch 1 is ready for use.

The invention claimed is:

1. A housing for a switch for railway applications, that in section or viewed from the side is roughly of L-section, wherein input ports and output ports on one leg project vertically upward therefrom and input ports and output ports project at right angles thereto from the other leg, the housing comprising:

an upper part;
 a lower part;
 a seal between the upper part and the lower part;
 a partition inside the housing and forming a part separate from the upper part and the lower part;
 a circuit board above and/or below the partition at the one leg; and,
 a further printed-circuit board approximately perpendicular to a lower face of the housing at the other leg.

2. The housing according to claim 1, wherein the partition has at least one throughgoing hole.

3. The housing according to claim 1, wherein the upper part and/or the lower part has cooling ribs on at least one end face.

* * * * *